US012501558B2

(12) United States Patent
Liu et al.

(10) Patent No.: US 12,501,558 B2
(45) Date of Patent: Dec. 16, 2025

(54) ASSEMBLED CABINET AND POWER CONNECTION BOARDS THEREOF

(71) Applicant: XIAMEN HEADLEADER TECHNOLOGY CO., LTD., Fujian (CN)

(72) Inventors: Tingpeng Liu, Fujian (CN); Junmin Lin, Fujian (CN); Jiasheng Zhang, Fujian (CN); Weiming Lin, Fujian (CN); Wang Chen, Fujian (CN); Zhaoqiang Yan, Fujian (CN); Xiaomin Chen, Fujian (CN)

(73) Assignee: XIAMEN HEADLEADER TECHNOLOGY CO., LTD., Xiamen (CN)

( * ) Notice: Subject to any disclaimer, the term of this patent is extended or adjusted under 35 U.S.C. 154(b) by 131 days.

(21) Appl. No.: 18/415,590

(22) Filed: Jan. 17, 2024

(65) Prior Publication Data

US 2024/0164029 A1     May 16, 2024

(51) Int. Cl.
*H05K 5/00* (2025.01)
*H01R 12/71* (2011.01)
*H01R 12/72* (2011.01)

(52) U.S. Cl.
CPC ......... *H05K 5/0065* (2013.01); *H01R 12/716* (2013.01); *H01R 12/724* (2013.01); *H05K 5/0069* (2013.01)

(58) Field of Classification Search
CPC .. H05K 5/0065; H05K 5/0069; H01R 12/716; H01R 12/724; H01R 13/02; H01R 13/22; A47B 47/0091; A47B 45/00; E05B 47/00; E05B 65/52
See application file for complete search history.

(56) References Cited

U.S. PATENT DOCUMENTS

| 6,185,773 | B1 * | 2/2001 | Goedde | G07C 9/28 340/5.1 |
| 8,928,454 | B2 * | 1/2015 | Brown | G07C 9/28 340/568.1 |
| 2009/0033456 | A1 * | 2/2009 | Castillo | G07C 11/00 340/5.2 |

FOREIGN PATENT DOCUMENTS

JP     6629517 B2 *  1/2020

OTHER PUBLICATIONS

Machine Translation for JP6629517B2 (Year: 2025).*

* cited by examiner

*Primary Examiner* — Sagar Shrestha
*Assistant Examiner* — Peter Krim
(74) *Attorney, Agent, or Firm* — Birchwood IP

(57) ABSTRACT

An assembled cabinet and power connection boards thereof, in which side board assemblies of the assembled cabinet are stacked in a way that upper power connectors of a power connection board of a lower side board assembly among two adjacent stacked up side board assemblies are electrically connected with lower power connectors of a power connection board of the an upper side board assembly among the two adjacent stacked up side board assemblies, so as to preserve the versatility and flexibility of the installation of the assembled cabinet while allowing stable power supply to the electronic locks of the assembled cabinet.

9 Claims, 14 Drawing Sheets

ASSEMBLED CABINET AND POWER CONNECTION BOARDS THEREOF

BACKGROUND OF THE INVENTION

The present invention relates to the field of storage cabinets, and in particular, to an assembled cabinet and power connection boards thereof.

An assembled cabinet is a cabinet formed by assembling a plurality of boards. Different number of storage spaces can be formed according to user's need. Therefore, installation of an assembled cabinet is versatile and flexible.

An assembled cabinet now available in the market may be installed with electronic locks to control doors of the assembled cabinet to open and shut. All the electronic locks require power to operate. If the assembled cabinet uses power from an external power source (e.g. switch mode power supply) to supply power to the electronic locks, grooves have to be designed on the assembled cabinet for wiring, and this is very complicated and disadvantageous in sacrificing the versatility and flexibility of the installation of the assembled cabinet. If the assembled cabinet uses internal batteries to supply power to the electronic locks, the internal batteries are susceptible to power depletion which leads to failure to open the electronic locks and thus resulting in bad user's experience.

In view of the aforesaid disadvantages in the prior art, there is a need to provide an assembled cabinet and power connection boards thereof to preserve the versatility and flexibility of the installation of the assembled cabinet while allowing stable power supply to the electronic locks.

BRIEF SUMMARY OF THE INVENTION

It is an object of the invention to provide an assembled cabinet and power connection boards thereof to preserve the versatility and flexibility of the installation of the assembled cabinet while allowing stable power supply to the electronic locks.

To achieve the above object, the present invention provides the following technical solutions:

A power connection board, comprising a board body, upper power connectors, lower power connectors, and an electronic lock; the upper power connectors, the lower power connectors and the electronic lock are installed on the board body;

the upper power connectors and the lower power connectors are exposed from an upper side and a bottom side of the board body respectively; the electronic lock is electrically connected to the upper power connectors and the lower power connectors.

The power connection board also comprises a power board; the power board is electrically connected to the upper power connectors, the lower power connectors, and the electronic lock.

The power board is electrically connected to the upper power connectors and the lower power connectors through wires.

The power connection board also comprises a shield board connected with the board body; the shield board shields the power board and the electronic lock.

The upper power connectors comprise an upper positive contact and an upper negative contact both facing upwardly; the lower power connectors comprise a lower positive contact and a lower negative contact both facing downwardly.

An assembled cabinet, comprising a top cover, a base, at least one intermediate board, and at least two sets of side board assemblies; each of the side board assemblies comprises the power connection board as described above, a connection side board, a backboard, and a door board; the power connection board and the connection side board are positioned oppositely with respect to each other; two sides of the backboard are connected to rear sides of the power connection board and the connection side board respectively; the door board is rotatable with respect to the connection side board; the door board is installed with a lock latch corresponding to the electronic lock of the power connection board; the side board assemblies are stacked wherein a corresponding intermediate board is disposed between two adjacent side board assemblies to connect the two adjacent side board assemblies; the power connection board and the connection side board of a highest side board assembly among the side board assemblies being stacked are connected to the top cover; the power connection board and the connection side board of a lowest side board assembly among the side board assemblies being stacked are connected to the base; each intermediate board is provided with a through hole corresponding to the upper power connectors of the power connection board of a lower side board assembly among the two adjacent side board assemblies, and the through hole also corresponds to the lower power connectors of the power connection board of an upper side board assembly among the two adjacent side board assemblies; said upper power connectors of the power connection board of the lower side board assembly among the two adjacent side board assemblies are electrically connected with said lower power connectors of the power connection board of the upper side board assembly among the two adjacent side board assemblies.

An electric connection assembly is provided in the through hole of each intermediate board; said upper power connectors of the power connection board of the lower side board assembly among the two adjacent side board assemblies are electrically connected with said lower power connectors of the power connection board of the upper side board assembly among the two adjacent side board assemblies through the electric connection assembly.

An upper side of the electric connection assembly is provided with a first upper conductive contact and a second upper conductive contact; a lower side of the electric connection assembly is provided with a first lower conductive contact and a second lower conductive contact; the first upper conductive contact is electrically connected to the first lower conductive contact, and the second upper conductive contact is electrically connected to the second lower conductive contact; the upper power connectors comprise an upper positive contact and an upper negative contact both facing upwardly; the lower power connectors comprise a lower positive contact and a lower negative contact both facing downwardly; the lower positive contact and the lower negative contact of said lower power connectors of the power connection board of the upper side board assembly among the two adjacent side board assemblies are in contact and electrically connected with the first upper conductive contact and the second upper conductive contact on the upper side of the electric connection assembly of the intermediate board connecting the two adjacent side board assemblies; the upper positive contact and the upper negative contact of said upper power connectors of the power connection board of the lower side board assembly among the two adjacent side board assemblies are in contact and electrically connected with the first lower conductive contact and the second lower conductive contact on the lower side of the electric connection assembly of the intermediate board connecting the two adjacent side board assemblies.

The power connection board of the highest side board assembly and the top cover, the connection side board of the highest side board assembly and the top cover, the power connection board of the lowest side board assembly and the base, the connection side board of the lowest side board assembly and the base B, the power connection board of each side board assembly and a corresponding intermediate board, and the connection side board of each side board assembly D and the corresponding intermediate board, are in each case connected through a connecting structure; wherein each connecting structure comprises a male connector and a female connector wherein the male connector is inserted into the female connector to achieve connection; each female connector comprises at least one insertion slot, and one side of each insertion slot is provided with a connection hole; one side of each male connector is provided with a protrusion, and the protrusion removably slides into the connection hole of a corresponding female connector after being inserted into the insertion slot of the corresponding female connector; the top cover, the base, and the corresponding intermediate board are in each case provided with said female connector of each corresponding connecting structure; the power connection board and the connection side board of each side board assembly are in each case provided with said male connector of each corresponding connecting structure.

The top cover comprises a connection port; the connection port is in contact and is therefore electrically connected to the upper power connectors of the power connection board of the highest side board assembly.

According to the present invention, since the upper power connectors and the lower power connectors are provided on the upper side and the lower side of each power connection board to supply power to the electronic locks, after the assembled cabinet of the present invention is assembled, power connection boards of two adjacent side board assemblies being stacked are connected through the lower power connectors of the upper side board assembly and the upper power connectors of the lower side board assembly, thereby achieving electrical connection as well. Accordingly, the present invention can supply power to all electronic locks on all the power connection boards by simply providing power supply to the upper power connectors of the power connection board of the highest side board assembly, or to the lower power connectors of the power connection board of the lowest side board assembly, thereby ensuring stable power supply to all the electronic locks. Further, grooves for wiring between the power supply and all the electronic locks are no longer required, thus preserving the versatility and flexibility of the installation of the assembled cabinet.

REFERENCE SIGNS IN THE FIGURES

Figure 1:
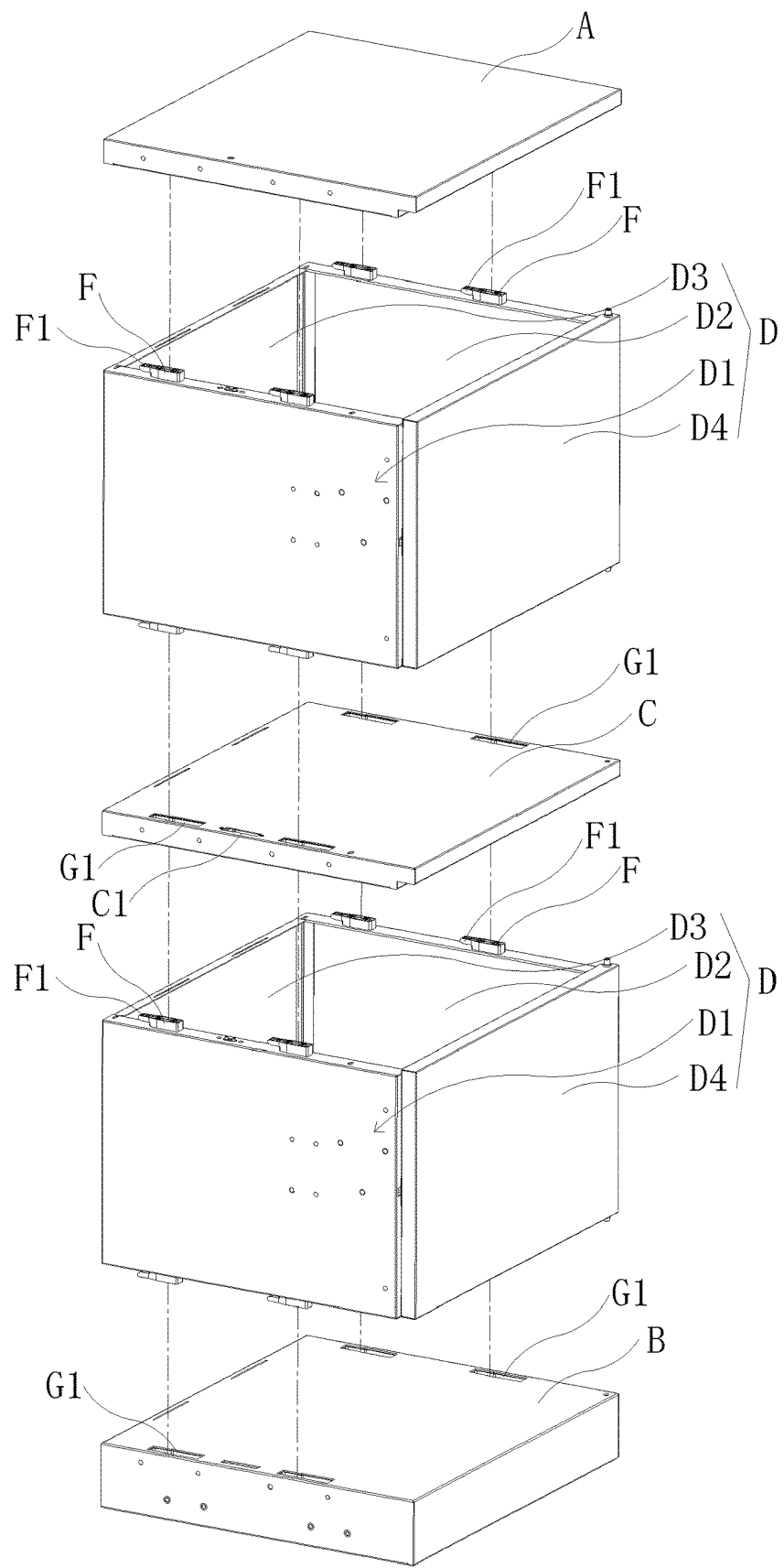
FIG. 1 is an exploded structural view of the assembled cabinet of the present invention.

Top cover A
Base B
Intermediate board C; through hole C1
Side board assembly D
Power connection board D1; board body 1; upper power connectors 2; upper positive contact 21; upper negative contact 22; lower power connectors 3; lower positive contact 31; lower negative contact 32; electronic lock 4; power board 5; wires 6; shield board 7;
Connection side board D2
Backboard D3;
Door board D4; lock latch D41;
Electric connection assembly E; upper board E1; first upper conductive contact E11; second upper conductive contact E12; lower board E2; first lower conductive contact E21; second lower conductive contact E22; connector wire E3;
Male connector F; protrusion F1;
Female connector G; insertion slot G1; connection hole G11;
Connection port H;
Connecting structure J.

DETAILED DESCRIPTION OF THE INVENTION

To further understand the technical solutions provided by the present invention, the present invention is further described below with reference to specific embodiments.

Figure 2:
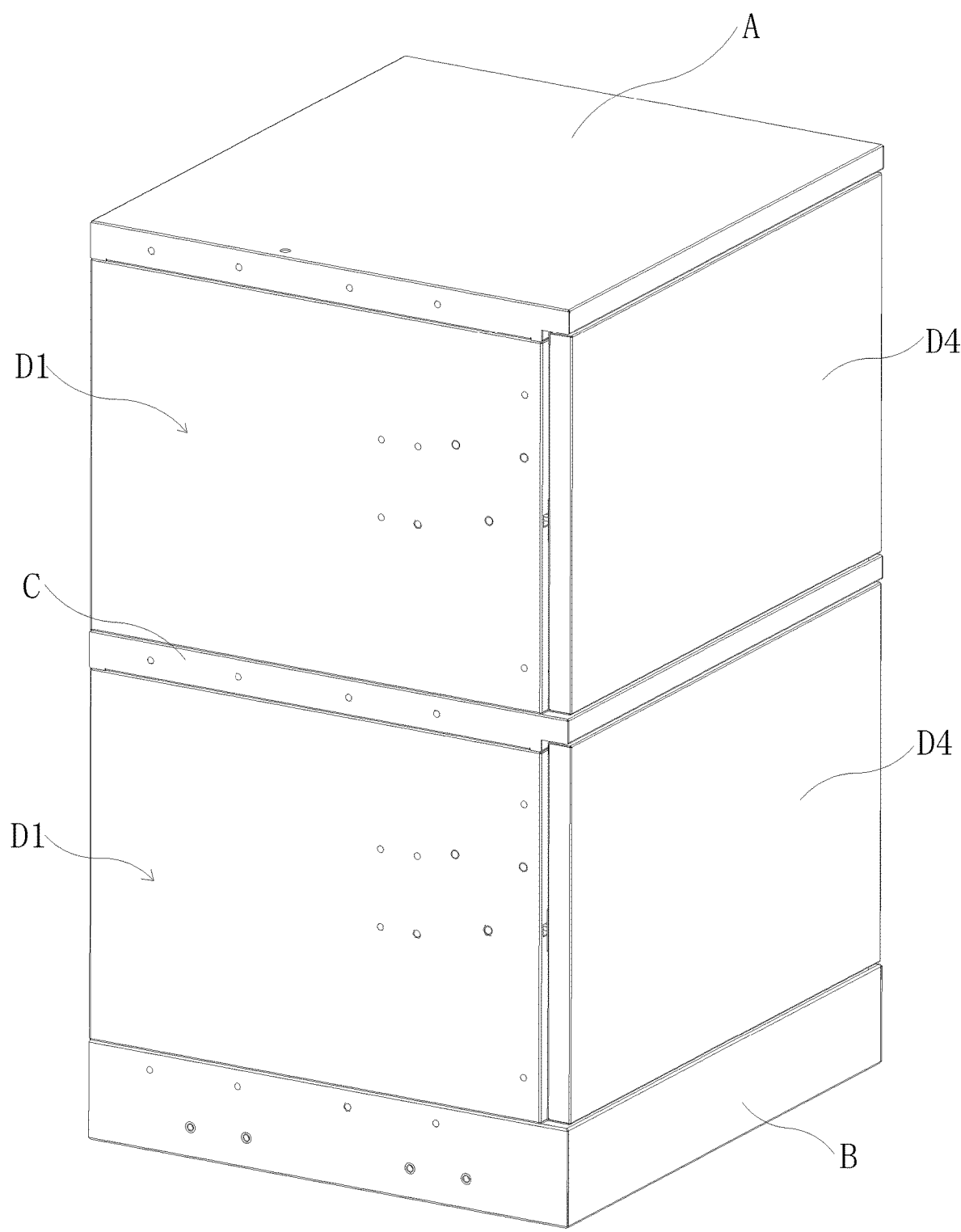
FIG. 2 is a schematic structural view of the assembled cabinet of the present invention.
Figure 3:
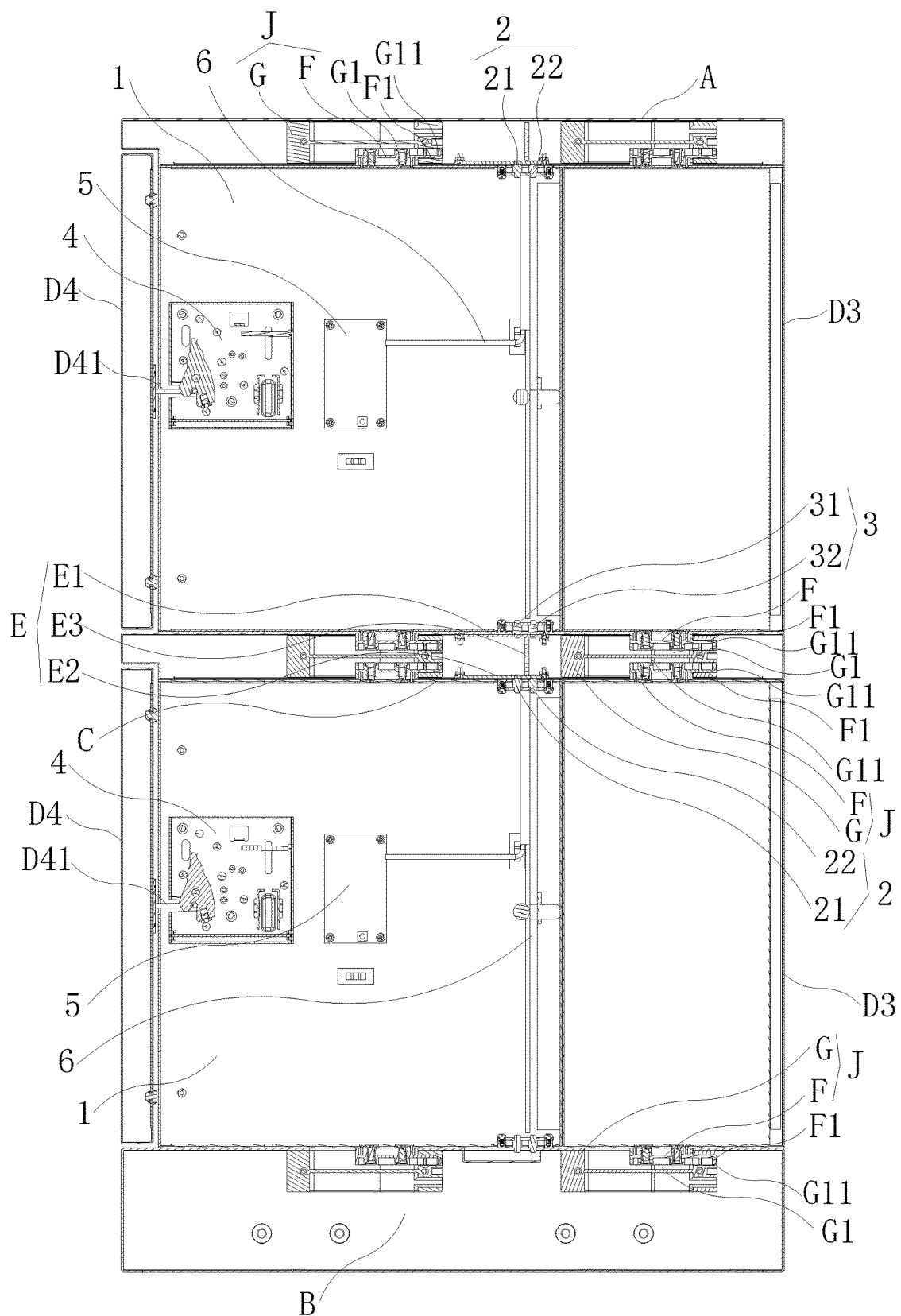
FIG. 3 is a first sectional view of the assembled cabinet of the present invention.
Figure 4:
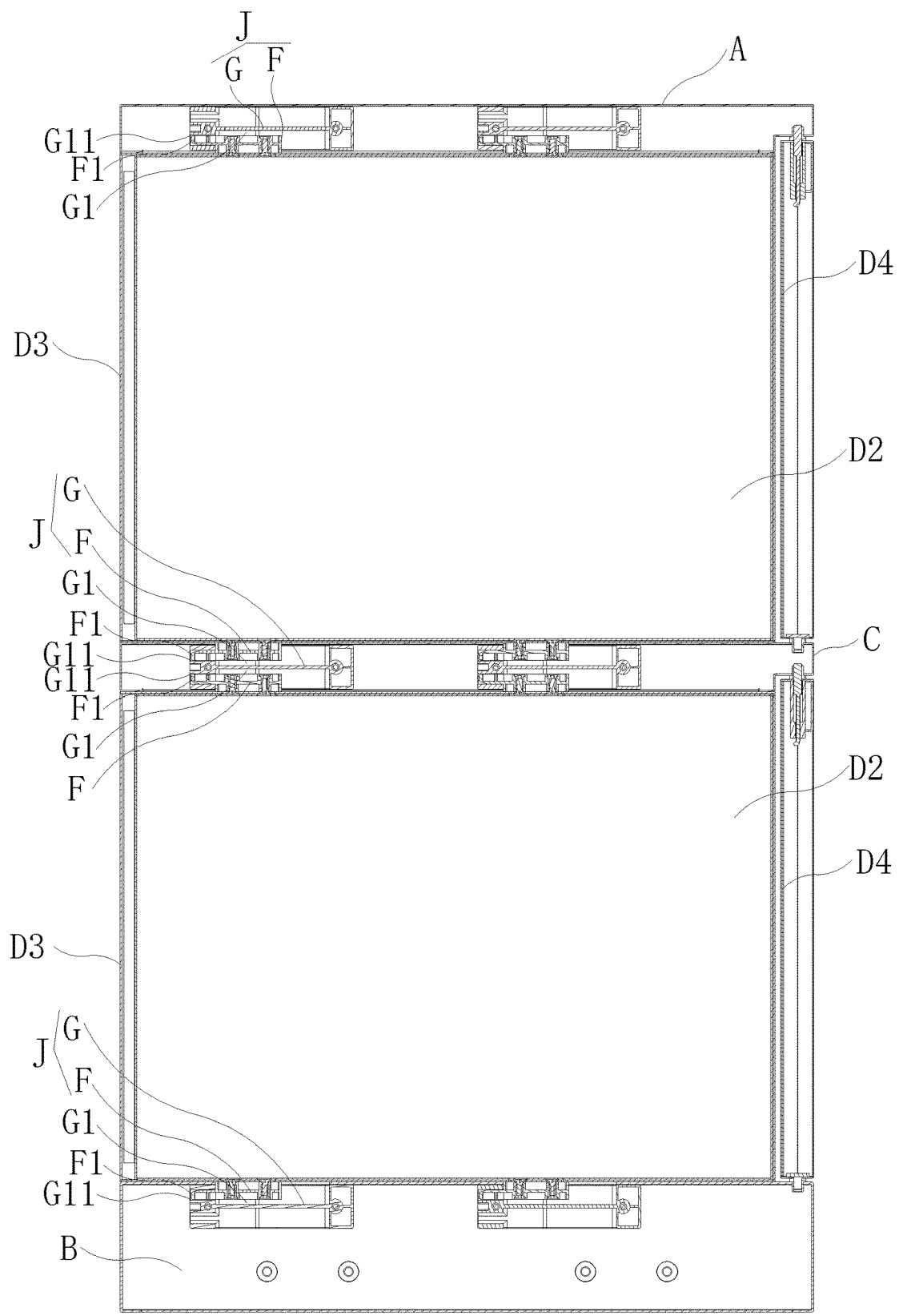
FIG. 4 is a second sectional view of the assembled cabinet of the present invention.
Figure 5:
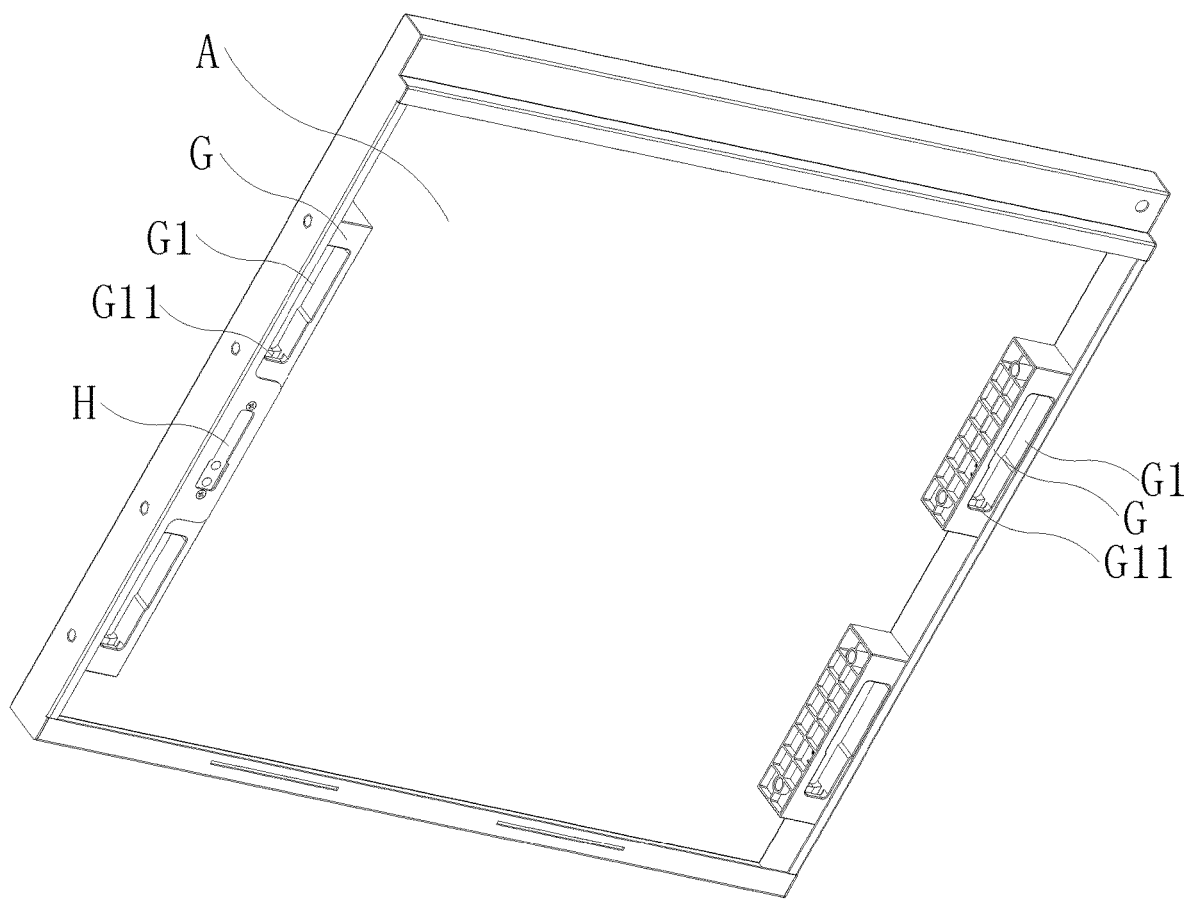
FIG. 5 is a structural view of a top cover of the assembled cabinet of the present invention.
Figure 6:
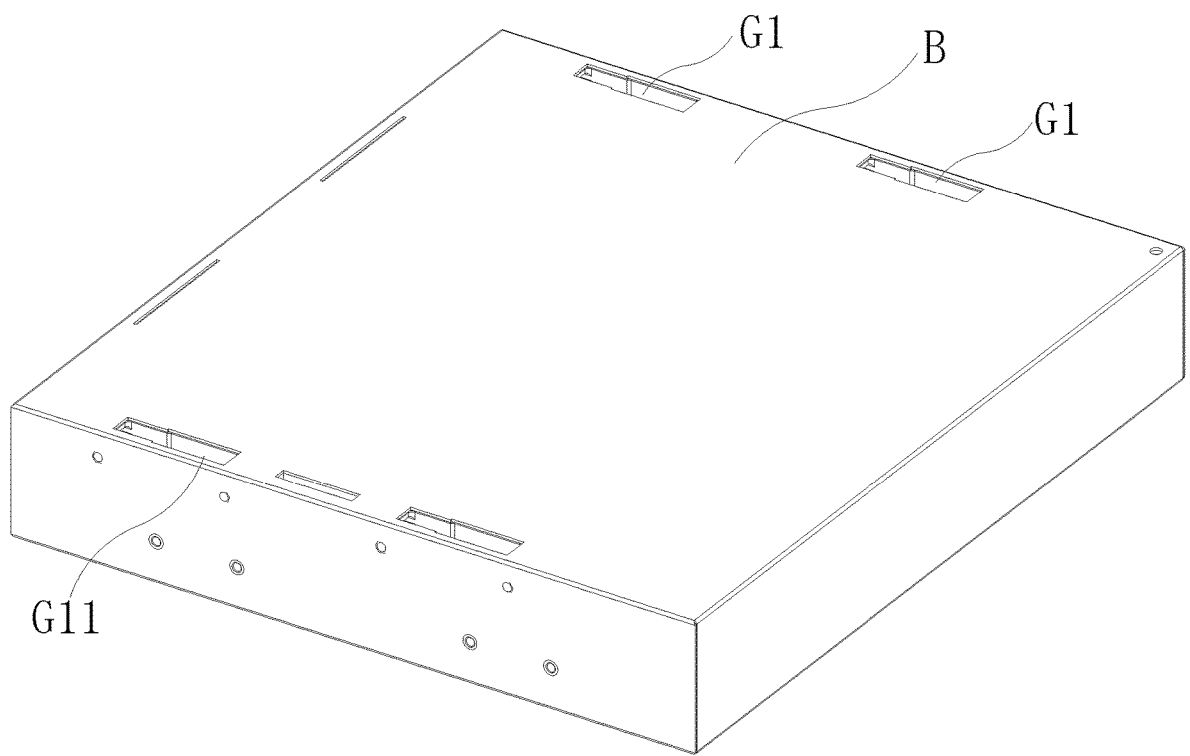
FIG. 6 is a first schematic structural view of a base of the assembled cabinet of the present invention.
Figure 7:
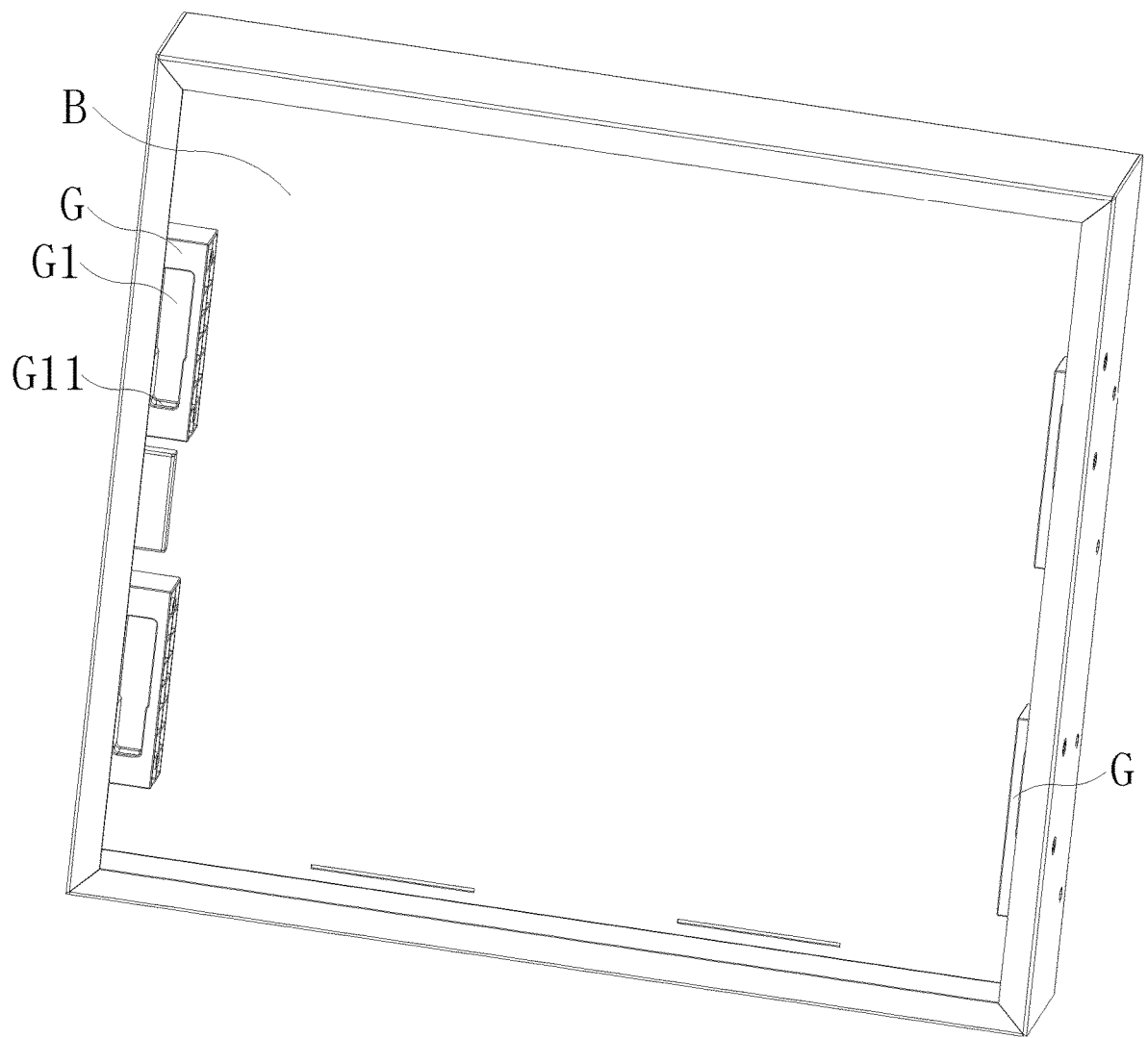
FIG. 7 is a second schematic structural view of the base of the assembled cabinet of the present invention.
Figure 8:
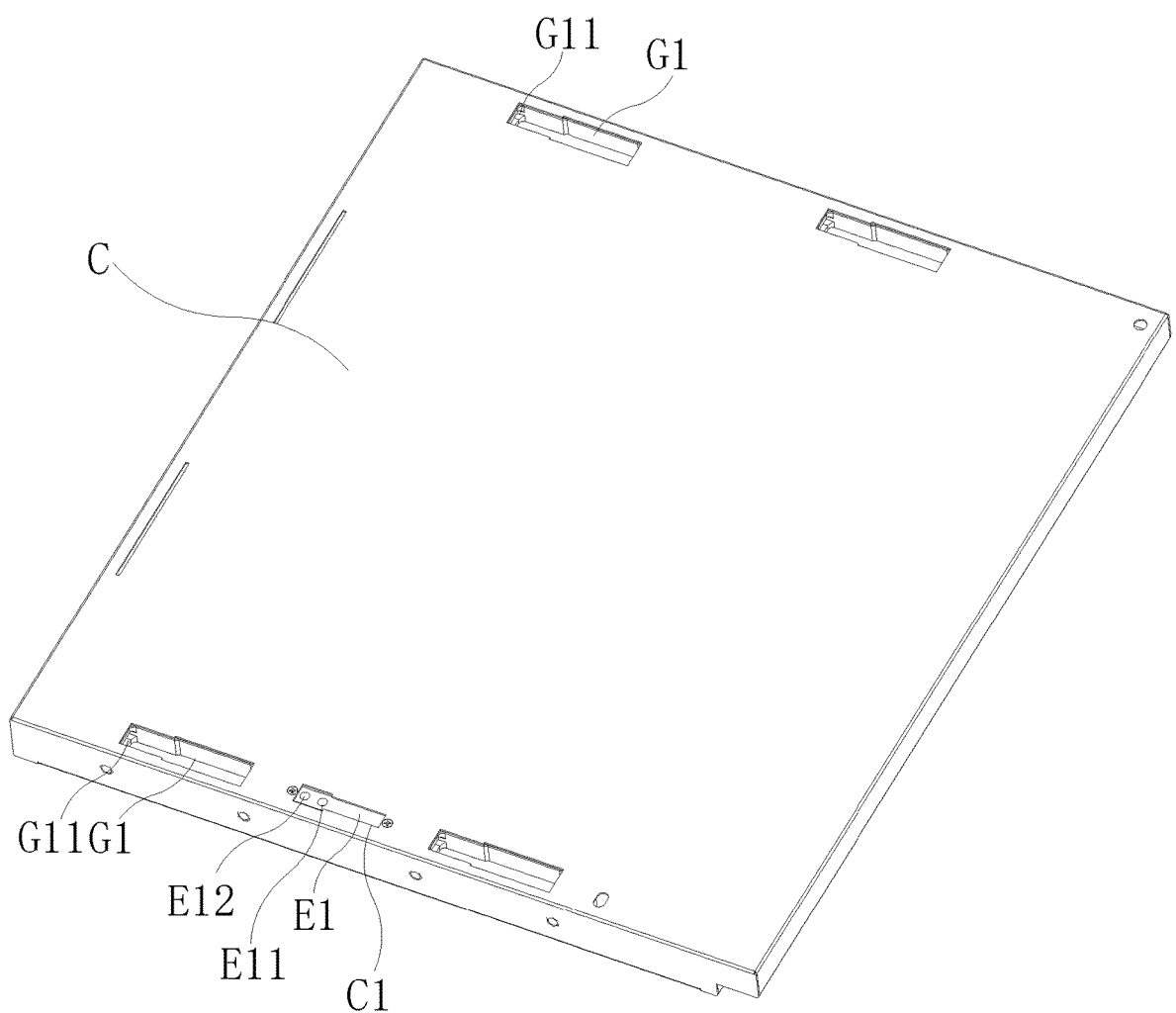
FIG. 8 is a first schematic structural view of an intermediate board of the assembled cabinet of the present invention.
Figure 9:
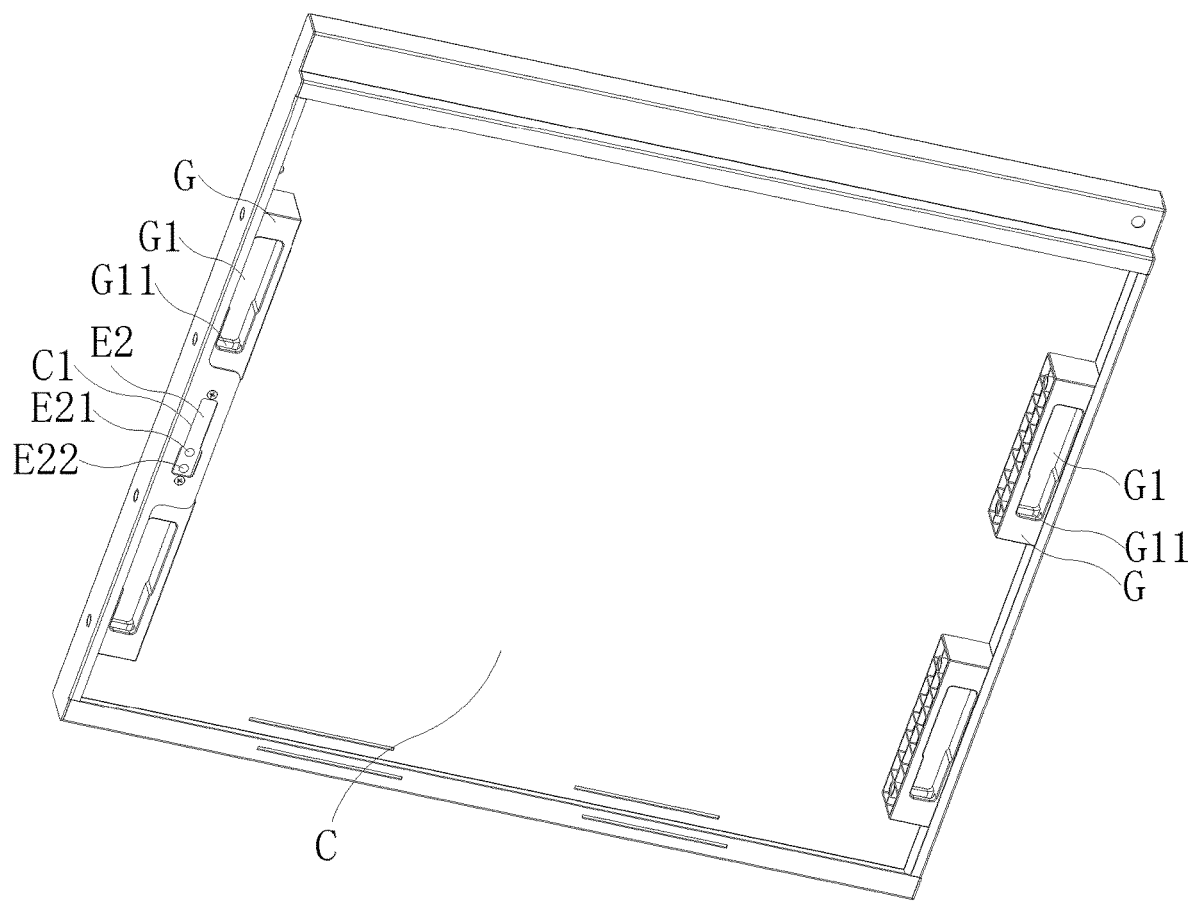
FIG. 9 is a second schematic structural view of the intermediate board of the assembled cabinet of the present invention.
Figure 10:
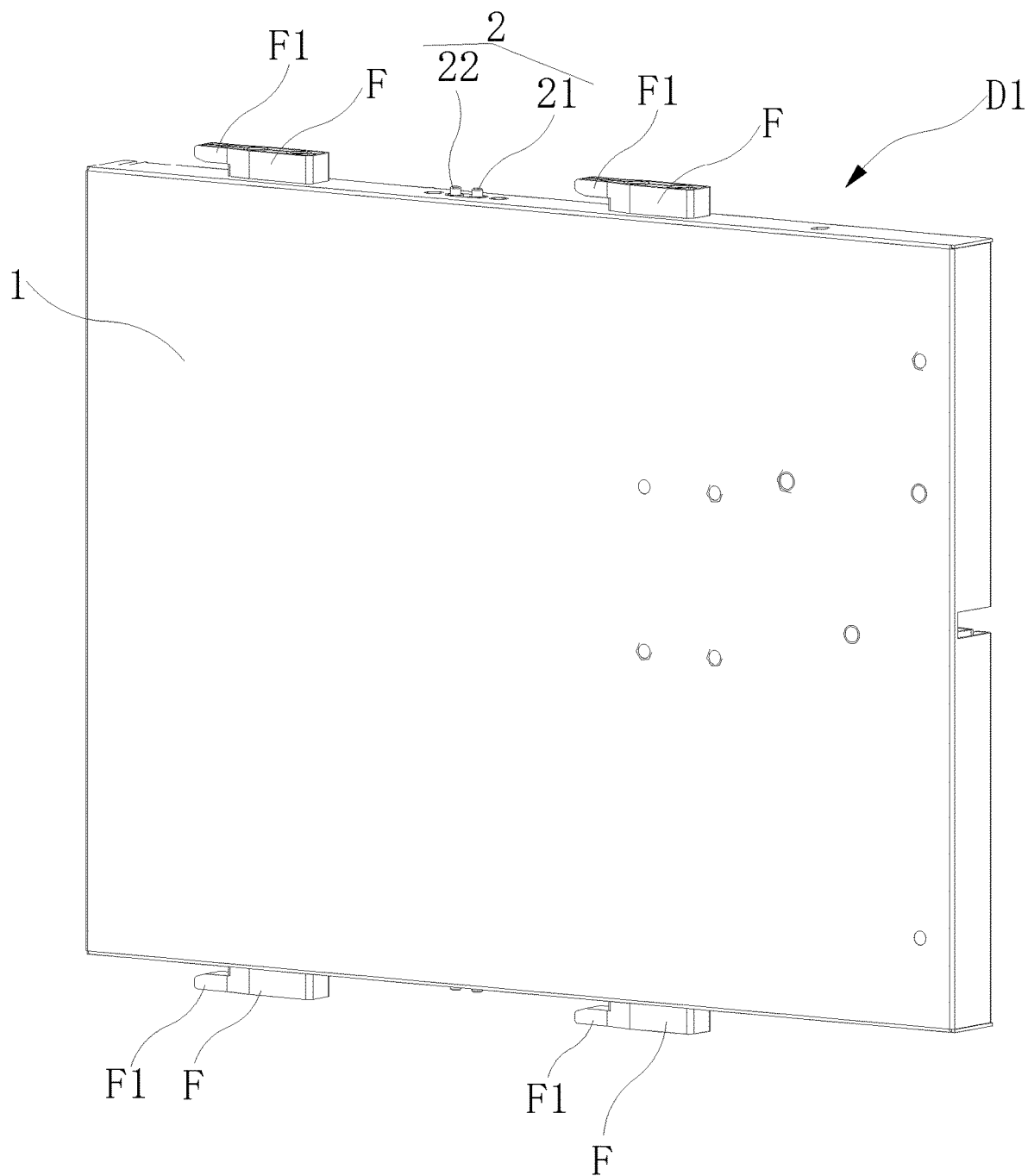
FIG. 10 is a first schematic structural view of a power connection board of the assembled cabinet of the present invention.
Figure 11:
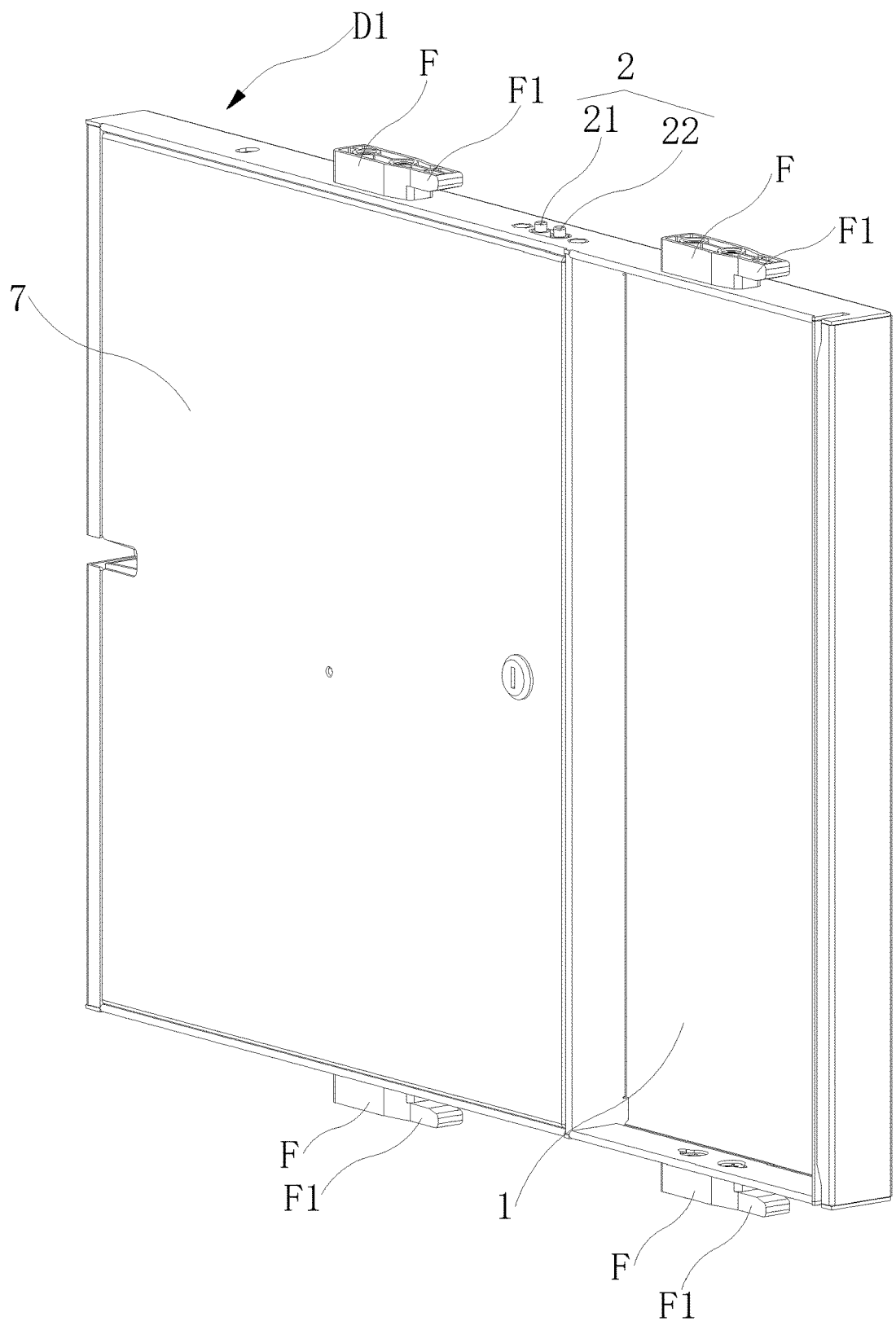
FIG. 11 is a second schematic structural view of the power connection board of the assembled cabinet of the present invention.
Figure 12:
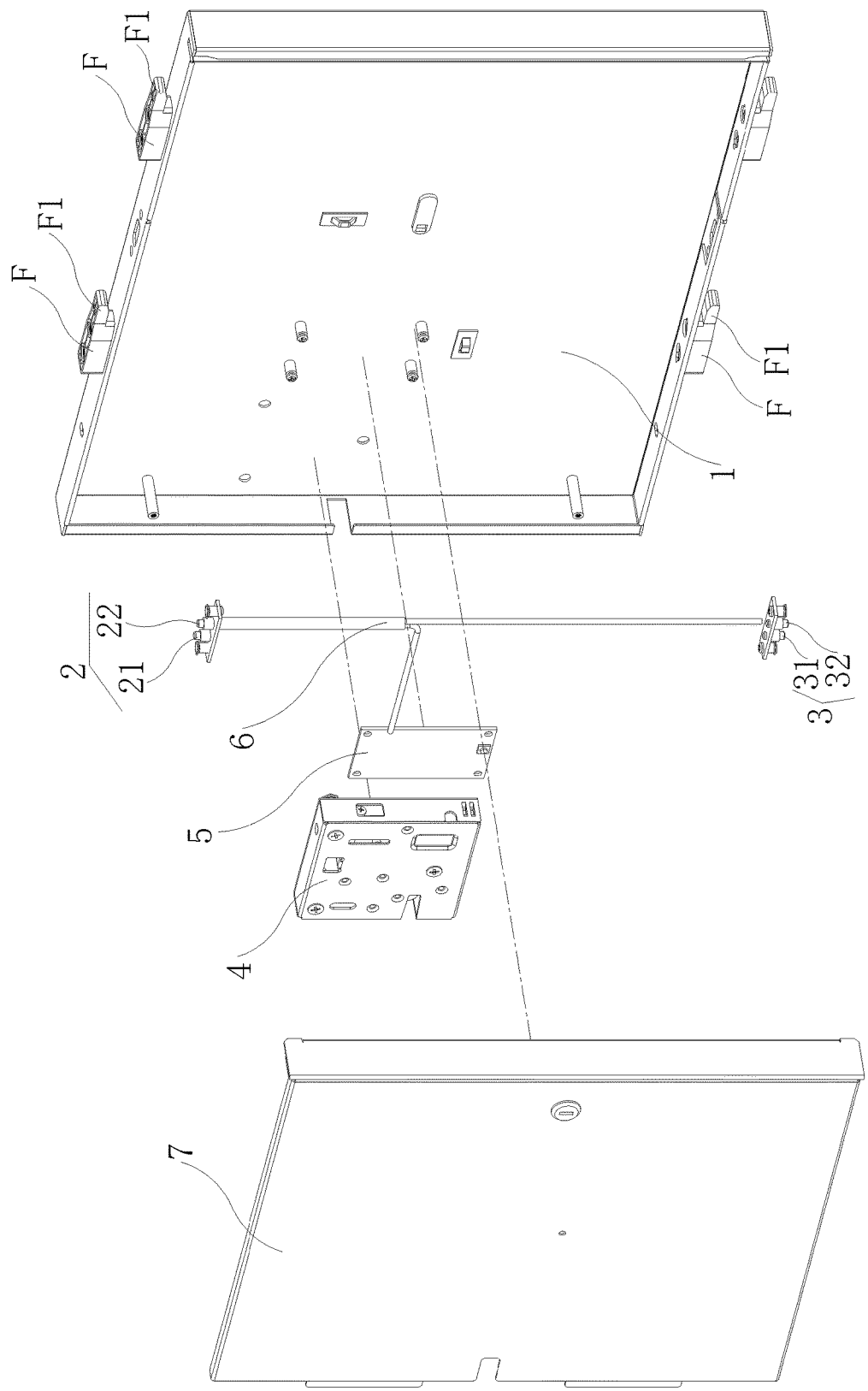
FIG. 12 is an exploded structural view of the power connection board of the assembled cabinet of the present invention.
Figure 13:
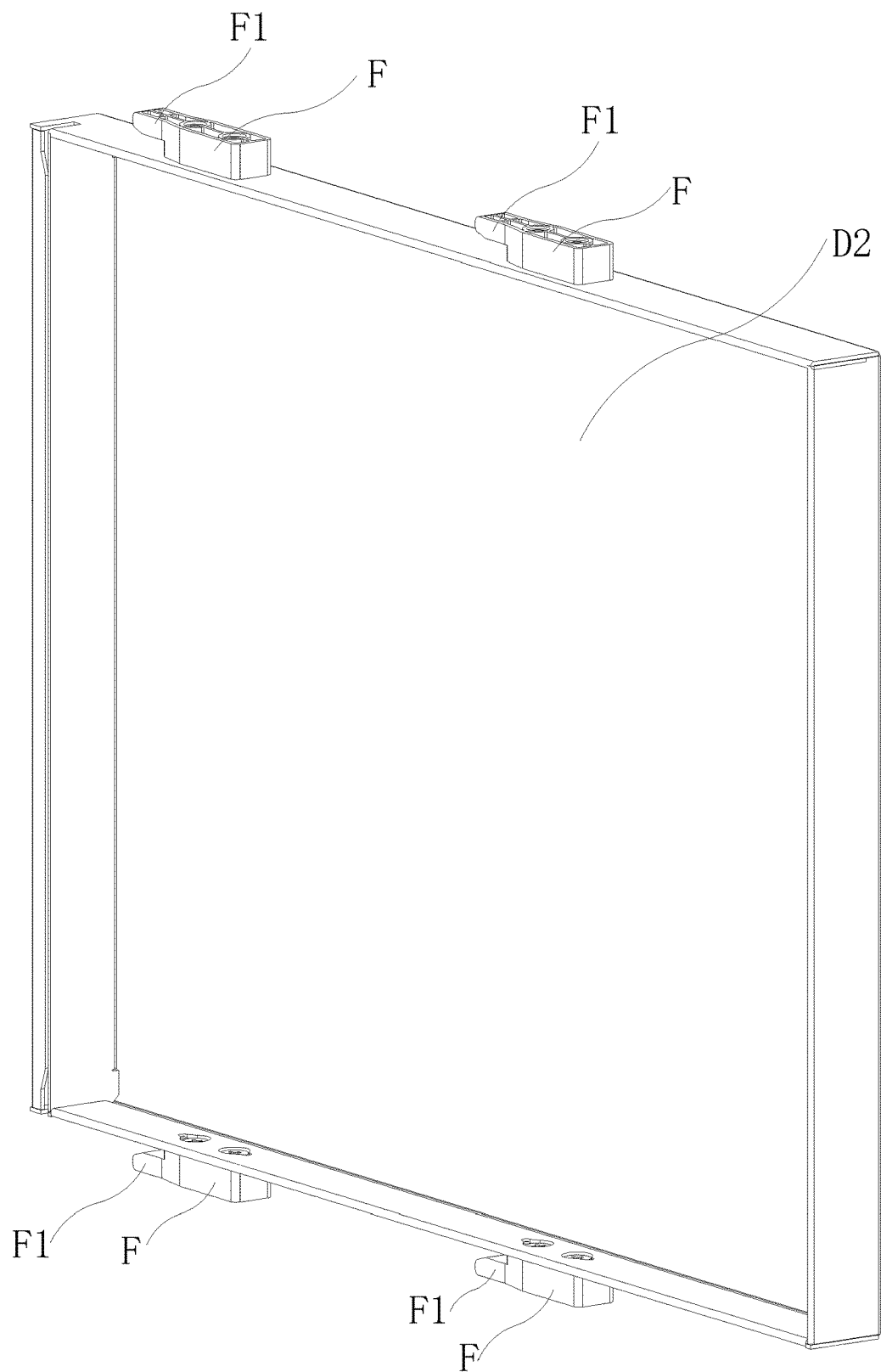
FIG. 13 is a schematic structural view of a connection side board of the assembled cabinet of the present invention.
Figure 14:
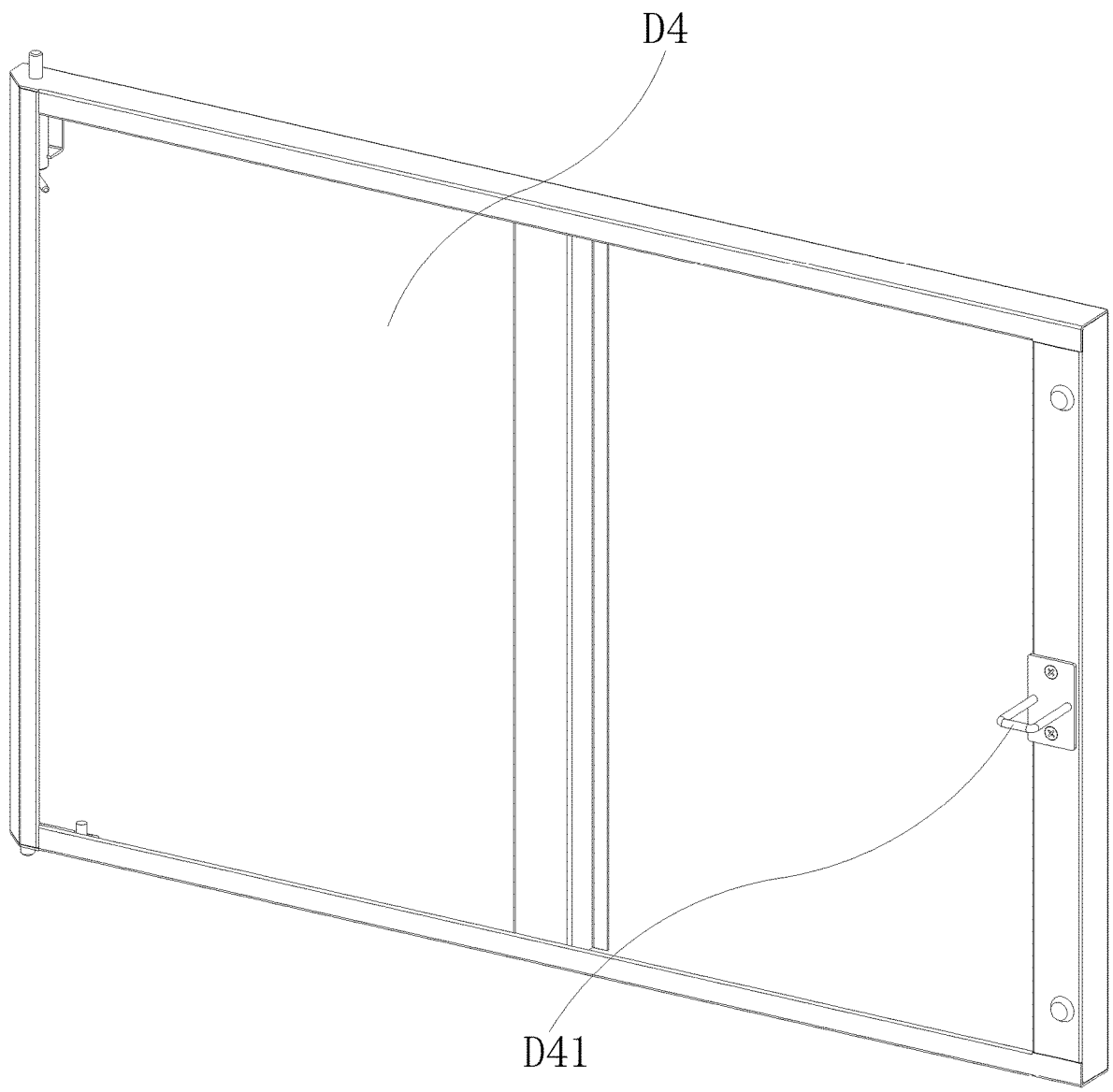
FIG. 14 is a schematic structural view of a door board of the assembled cabinet of the present invention.

As shown in FIGS. 1-14, the present invention provides an assembled cabinet, comprising a top cover A, a base B, at least one intermediate board C, and at least two sets of side board assemblies D; each of the side board assemblies D comprises a power connection board D1, a connection side board D2, a backboard D3, and a door board D4. The power connection board D1 and the connection side board D2 are positioned oppositely with respect to each other; two sides of the backboard D3 are connected, preferably by insertion, to rear sides of the power connection board D1 and the connection side board D2 respectively; the door board D4 is hinged to the top cover A/the base B, and/or said at least one intermediate board C, and/or to the connection side board D2, so that the door board D4 is rotatable with respect to the connection side board D2. The side board assemblies D are stacked wherein a corresponding intermediate board C is disposed between two adjacent side board assemblies D to connect the two adjacent side board assemblies D. The power connection board D1 and the connection side board D2 of a highest side board assembly D among the side board assemblies D being stacked are connected to the top cover A; the power connection board D1 and the connection side board D2 of a lowest side board assembly D among the side board assemblies D being stacked are connected to the base B.

According to an embodiment, the power connection board D1 comprises a board body 1, upper power connectors 2, lower power connectors 3, and an electronic lock 4; the upper power connectors 2, the lower power connectors 3 and the electronic lock 4 are installed on the board body 1. The upper power connectors 2 and the lower power connectors 3 are exposed from an upper side and a bottom side of the board body 1 respectively. The electronic lock 4 is electrically connected to the upper power connectors 2 and the lower power connectors 3. The door board D4 is installed with a lock latch D41 corresponding to the electronic lock 4 of the power connection board D1. Each intermediate board C is provided with a through hole C1 corresponding to the upper power connectors 2 of the power connection board D1 of a lower side board assembly D among two adjacent side board assemblies D, and the through hole C1 also corresponds to the lower power connectors 3 of the power connection board D1 of an upper side board assembly D among the two adjacent side board assemblies D. Said upper power connectors 2 of the power connection board D1 of the lower side board assembly D among the two adjacent side board assemblies D are electrically connected with said lower power connectors 3 of the power connection board D1 of the upper side board assembly D among the two adjacent side board assemblies D. According to the present invention, since the upper power connectors 2 and the lower power connectors 3 are provided on the upper side and the lower side of each power connection board D1 to supply power to the electronic locks 4, after the assembled cabinet of the present invention is assembled, power connection boards D1 of two adjacent side board assemblies D being stacked are connected through the lower power connectors 3 of the upper side board assembly and the upper power connectors 2 of the lower side board assembly, thereby achieving electrical connection as well. Accordingly, the present invention can supply power to all electronic locks 4 on all the power connection boards D1 by simply providing power supply to the upper power connectors 2 of the power connection board D1 of the highest side board assembly D, or to the lower power connectors 3 of the power connection board D1 of the lowest side board assembly D, thereby ensuring stable power supply to all the electronic locks 4. Further, grooves for wiring between the power supply and all the electronic locks 4 are no longer required, thus preserving the versatility and flexibility of the installation of the assembled cabinet.

According to an embodiment of the present invention, each power connection board D1 also comprises a power board 5; the power board 5 is electrically connected to the upper power connectors 2, the lower power connectors 3, and the electronic lock 4; the power board 5 converts the power supplied to the upper power connectors 2 and the lower power connectors 3, so that the electronic locks 4 of the present invention are powered with stable power supply voltage. The power board 5 is electrically connected to the upper power connectors 2 and the lower power connectors 3 through wires 6.

According to an embodiment of the present invention, each power connection board D1 also comprises shield board 7 connected with the board body 1. The shield board 7 shields and thus protects the power board 5, the electronic lock 4 and the wires 6, and provides a more neat and integral appearance of the power connection board D1.

According to an embodiment, an electric connection assembly E is provided in the through hole C1 of each intermediate board C; said upper power connectors 2 of the power connection board D1 of the lower side board assembly D among the two adjacent side board assemblies D are electrically connected with said lower power connectors 3 of the power connection board D1 of the upper side board assembly D among the two adjacent side board assemblies D through said electric connection assembly E. Specifically, an upper side of the electric connection assembly E is provided with a upper board E1, on which a first upper conductive contact E11 and a second upper conductive contact E12 are arranged; a lower side of the electric connection assembly E is provided with a lower board E2, on which a first lower conductive contact E21 and a second lower conductive contact E22 are arranged; a connector wire E3 is provided to connect between the upper board and the lower board so that the first upper conductive contact E11 is electrically connected to the first lower conductive contact E21, and the second upper conductive contact E12 is electrically connected to the second lower conductive contact E22; the upper power connectors 2 comprise an upper positive contact 21 and an upper negative contact 22 both facing upwardly; the lower power connectors 3 comprise a lower positive contact 31 and a lower negative contact 32 both facing downwardly. The lower positive contact 31 and the lower negative contact 32 of said lower power connectors 3 of the power connection board D of the upper side board assembly D among the two adjacent side board assemblies D are in contact and electrically connected with the first upper conductive contact E11 and the second upper conductive contact E2 on the upper side of the electric connection assembly E of the intermediate board C connecting the two adjacent side board assemblies D; the upper positive contact 21 and the upper negative contact 22 of said upper power connectors 2 of the power connection board D1 of the lower side board assembly D among the two adjacent side board assemblies D are in contact and electrically connected with the first lower conductive contact E21 and the second lower conductive contact E22 on the lower side of the electric connection assembly E of the intermediate board C connecting the two adjacent side board assemblies D. Accordingly, said upper power connectors 2 of the power connection board D1 of the lower side board assembly D among the two adjacent side board assemblies D are electrically connected with said lower power connectors 3 of the power connection board D1 of the upper side board assembly D among the two adjacent side board assemblies D through contact with the corresponding electric connection assembly E, and as such, installation of all the power connection boards D1, the intermediate boards C, the top cover A, and the base B will not be hindered, thereby ensuring versatility and flexibility of the installation of the assembled cabinet.

According to an embodiment, the power connection board D1 of the highest side board assembly D and the top cover A, the connection side board D2 of the highest side board assembly D and the top cover A, the power connection board D1 of the lowest side board assembly D and the base B, the connection side board D2 of the lowest side board assembly D and the base B, the power connection board D1 of each side board assembly D and a corresponding intermediate board C, and the connection side board D2 of each side board assembly D and the corresponding intermediate board C, are in each case connected through a connecting structure to facilitate assembly of the assembled cabinet. Specifically, each connecting structure comprises a male connector F and a female connector G wherein the male connector F is inserted into the female connector G to achieve connection. More specifically, the top cover A, the base B, and the corresponding intermediate board C are in each case provided with said female connector G in each connecting structure; the power connection board D1 and the connection side board D2 of each side board assembly D are in each case provided with said male connector F in each connecting structure. Each female connector G comprises at least one insertion slot G1, and one side of each insertion slot G1 is provided with a connection hole G11; one side of each male connector F is provided with a protrusion F1, and the protrusion F1 removably slides into the connection hole G11 of a corresponding female connector G after being inserted into the insertion slot G1 of the corresponding female connector G, thereby connecting the male connector F with the corresponding female connector G.

According to an embodiment, the top cover A comprises connection port H to connect with the external power source; the connection port H is in contact and is therefore electrically connected to the upper power connectors 2 of the power connection board D1 of the highest side board assembly D. It should be understood that, the connection port H is not limited to be positioned on the top cover A, but can also be positioned on the base B. In case the connection port H is positioned on the base B, the connection port H is in contact and is therefore electrically connected to the lower power connectors 3 of the power connection board D1 of the lowest side board assembly D.

The above embodiments and the drawings are not intended to limit the form and type of the present invention. Any appropriate changes or modifications made by a person skilled in this field of art shall also fall within the scope of the present invention.

What is claimed is:

1. An assembled cabinet, comprising a top cover, a base, at least one intermediate board, and at least two sets of side board assemblies; each of the side board assemblies comprises a power connection board, a connection side board, a backboard, and a door board; the power connection board and the connection side board are positioned oppositely with respect to each other; two sides of the backboard are connected to rear sides of the power connection board and the connection side board respectively; the door board is rotatable with respect to the connection side board; the door board is installed with a lock latch corresponding to the electronic lock of the power connection board;

the power connection board has a board body, upper power connectors, lower power connectors, and an electronic lock; the upper power connectors, the lower power connectors and the electronic lock are installed on the board body; the upper power connectors and the lower power connectors are exposed from an upper side and a bottom side of the board body respectively; the electronic lock is electrically connected to the upper power connectors and the lower power connectors;

the side board assemblies are stacked wherein a corresponding intermediate board is disposed between two adjacent side board assemblies to connect the two adjacent side board assemblies; the power connection board and the connection side board of a highest side board assembly among the side board assemblies being stacked are connected to the top cover; the power connection board and the connection side board of a lowest side board assembly among the side board assemblies being stacked are connected to the base; each intermediate board is provided with a through hole corresponding to the upper power connectors of the power connection board of a lower side board assembly among the two adjacent side board assemblies, and the through hole also corresponds to the lower power connectors of the power connection board of an upper side board assembly among the two adjacent side board assemblies; said upper power connectors of the power connection board of the lower side board assembly among the two adjacent side board assemblies are electrically connected with said lower power connectors of the power connection board of the upper side board assembly among the two adjacent side board assemblies.

2. The assembled cabinet of claim 1, wherein an electric connection assembly is provided in the through hole of each intermediate board; said upper power connectors of the power connection board of the lower side board assembly among the two adjacent side board assemblies are electrically connected with said lower power connectors of the power connection board of the upper side board assembly among the two adjacent side board assemblies through the electric connection assembly.

3. The assembled cabinet of claim 2, wherein an upper side of the electric connection assembly is provided with a first upper conductive contact and a second upper conductive contact; a lower side of the electric connection assembly is provided with a first lower conductive contact and a second lower conductive contact; the first upper conductive contact is electrically connected to the first lower conductive contact, and the second upper conductive contact is electrically connected to the second lower conductive contact;

the upper power connectors comprise an upper positive contact and an upper negative contact both facing upwardly; the lower power connectors comprise a lower positive contact and a lower negative contact both facing downwardly;

the lower positive contact and the lower negative contact of said lower power connectors of the power connection board of the upper side board assembly among the two adjacent side board assemblies are in contact and electrically connected with the first upper conductive contact and the second upper conductive contact on the upper side of the electric connection assembly of the intermediate board connecting the two adjacent side board assemblies;

the upper positive contact and the upper negative contact of said upper power connectors of the power connection board of the lower side board assembly among the two adjacent side board assemblies are in contact and electrically connected with the first lower conductive contact and the second lower conductive contact on the lower side of the electric connection assembly of the intermediate board connecting the two adjacent side board assemblies.

4. The assembled cabinet of claim 1, wherein the power connection board of the highest side board assembly and the top cover, the connection side board of the highest side board assembly and the top cover, the power connection board of the lowest side board assembly and the base, the connection side board of the lowest side board assembly and the base, the power connection board of each side board assembly and a corresponding intermediate board, and the connection side board of each side board assembly and the corresponding intermediate board, are in each case connected through a connecting structure;

each connecting structure comprises a male connector and a female connector wherein the male connector is inserted into the female connector to achieve connection; each female connector comprises at least one insertion slot, and one side of each insertion slot is provided with a connection hole; one side of each male connector is provided with a protrusion, and the protrusion removably slides into the connection hole of a corresponding female connector after being inserted into the insertion slot of the corresponding female connector;

the top cover, the base, and the corresponding intermediate board are in each case provided with said female connector of each corresponding connecting structure; the power connection board and the connection side board of each side board assembly are in each case provided with said male connector of each corresponding connecting structure.

5. The assembled cabinet of claim 1, wherein the top cover comprises a connection port; the connection port is in contact and is therefore electrically connected to the upper power connectors of the power connection board of the highest side board assembly.

6. The assembled cabinet of claim 1, wherein the power connection board further comprises a power board; the power board is electrically connected to the upper power connectors, the lower power connectors, and the electronic lock.

7. The assembled cabinet of claim 6, wherein the power board is electrically connected to the upper power connectors and the lower power connectors through wires.

8. The assembled cabinet of claim 6, wherein the power connection board further comprises a shield board connected with the board body; the shield board shields the power board and the electronic lock.

9. The assembled cabinet of claim 1, wherein the upper power connectors comprise an upper positive contact and an upper negative contact both facing upwardly; the lower power connectors comprise a lower positive contact and a lower negative contact both facing downwardly.

\* \* \* \* \*